(12) United States Patent
Loh et al.

(10) Patent No.: US 6,388,457 B1
(45) Date of Patent: May 14, 2002

(54) AUTOMATED MONITORING OF PLACEMENT OF AN IC PACKAGE ONTO A SOCKET FOR PROPER ORIENTATION AND PROPER ALIGNMENT

(75) Inventors: Yeow Kwang Loh; Gim Leong Tan; Hock Chuan Koh; Kah Shan Chen, all of Singapore (SG)

(73) Assignee: Advanced Micro Devices, Inc., Sunnyvale, CA (US)

( * ) Notice: Subject to any disclaimer, the term of this patent is extended or adjusted under 35 U.S.C. 154(b) by 44 days.

(21) Appl. No.: 09/603,863

(22) Filed: Jun. 26, 2000

(51) Int. Cl.[7] ............................................... G01R 31/02
(52) U.S. Cl. ..................... 324/755; 324/158.1
(58) Field of Search ................. 324/754, 755, 324/758, 765, 158.1; 356/400, 401

(56) References Cited

U.S. PATENT DOCUMENTS

| | | | | |
|---|---|---|---|---|
| 4,820,975 A | * | 4/1989 | Diggle | 324/758 |
| 4,864,227 A | * | 9/1989 | Sato | 324/754 |
| 4,929,893 A | * | 5/1990 | Sato et al. | 324/758 |

\* cited by examiner

Primary Examiner—Safet Metjahic
Assistant Examiner—Minh N. Tang
(74) Attorney, Agent, or Firm—Monica H. Choi

(57) ABSTRACT

A socket cover is mounted onto a socket for monitoring that an IC (integrated circuit) package is properly placed onto the socket with proper orientation and proper alignment. The socket cover includes a platform that is attached on top of the socket, and the platform has an opening for exposing pins of the socket when the platform is attached onto the top of the socket. The IC package is placed within the opening of the platform and onto the pins of the socket for testing of the IC package. A signal generator is disposed on a first side of the opening of the platform for emitting a signal across the opening toward a second side of the opening. A signal detector is disposed on the second side of the opening of the platform, and the signal detector is aligned with the signal generator such that the signal detector detects the signal emitted by the signal generator when the signal is not blocked. The signal detector detects the signal emitted by the signal generator when the IC package that is placed with proper orientation and proper alignment within the opening of the platform does not block the signal. Alternatively, the signal detector does not detect the signal emitted by the signal generator when the IC package that is placed with improper orientation or improper alignment within the opening of the platform does block the signal.

16 Claims, 6 Drawing Sheets

AUTOMATED MONITORING OF PLACEMENT OF AN IC PACKAGE ONTO A SOCKET FOR PROPER ORIENTATION AND PROPER ALIGNMENT

TECHNICAL FIELD

The present invention relates generally to test stations for IC (integrated circuit) packages, and more particularly, to a socket cover with a signal emitter and a signal detector for automatically monitoring that an IC package is placed onto a socket of a test station with proper orientation and proper alignment for testing the IC package.

BACKGROUND OF THE INVENTION

During manufacture of IC (integrated circuit) packages, the IC packages are tested for determining various performance characteristics of such IC packages, as known to one of ordinary skill in the art of IC package manufacture. Referring to FIG. 1, an IC package 102 is placed onto a socket 104 of a test station for testing of the IC package 102. The socket 104 has a plurality of pins within a socket opening 106 including a first pin 112, a second pin 114, a third pin 116, a fourth pin 118, a fifth pin 120, a sixth pin 122, a seventh pin 124, an eighth pin 126, and a ninth pin 128. A socket typically has more numerous pins therein, but nine pins are shown within the socket opening 106 of FIG. 1 for clarity of illustration.

Referring to FIGS. 1 and 2, the IC package 102 is placed onto the socket 104 for testing of the IC package 102 at a test station. Referring to FIG. 3, a bottom view of the IC package 102 shows a plurality of contact pads for making contact with the plurality of pins within the socket opening 106 when the IC package 102 is placed onto the socket 104 with proper orientation and with proper alignment. Elements having the same reference number in FIGS. 1, 2, and 3 refer to elements having similar structure and function. For proper orientation, a predetermined corner 129 of the IC package 102 is matched with a predetermined corner 130 of the socket opening 106.

When the IC package 102 is placed onto the socket 104 with proper orientation and with proper alignment, a first contact pad 132 makes contact with the first pin 112, a second contact pad 134 makes contact with the second pin 114, a third contact pad 136 makes contact with the third pin 116, a fourth contact pad 138 makes contact with the fourth pin 118, a fifth contact pad 140 makes contact with the fifth pin 120, a sixth contact pad 142 makes contact with the sixth pin 122, a seventh contact pad 144 makes contact with the seventh pin 124, an eighth contact pad 146 makes contact with the eighth pin 126, and a ninth contact pad 148 makes contact with the ninth pin 128.

Each of the contact pads 132, 134, 136, 138, 140, 142, 144, 146, and 148 is for providing connection to a respective node of the integrated circuit within the IC package 102, as known to one of ordinary skill in the art of IC package manufacture. Each of the pins 112, 114, 116, 118, 120, 122, 124, 126, and 128 of the socket 104 is for coupling a respective contact pad of the IC package 102 to a test station, as known to one of ordinary skill in the art of IC package manufacture.

Referring to FIG. 2, when the IC package 102 is placed onto the socket 104 for testing of the IC package 102, a cylinder head 150 extends down onto the IC package 102. The cylinder head 150 presses the IC package 102 against the pins of the socket 104 for ensuring that each of the contact pads 132, 134, 136, 138, 140, 142, 144, 146, and 148 of the IC package 102 contacts a respective one of the pins 112, 114, 116, 118, 120, 122, 124, 126, and 128 of the socket 104, as described herein.

Unfortunately, if the IC package 102 is not placed onto the socket 104 with proper orientation and with proper alignment, when the cylinder head 150 extends down onto the IC package 102, the IC package 102 may undesirably break. During testing of IC packages at a test station, an operator loads and unloads a large quantity of IC packages in a work day. For example, thousands of IC packages may be loaded into and unloaded from the socket 104 by an operator during a work day. With handling of such a large quantity of IC packages, the operator is prone to human error of placing an IC package onto the socket 104 with improper orientation or with improper alignment. When, the cylinder head 150 extends down onto such an IC package that is placed onto the socket 104 with improper orientation or with improper alignment, the IC package breaks resulting in loss of yield during IC package production.

Thus, a mechanism is desired for automatically monitoring that an IC package is placed onto a socket of a test station with proper orientation and proper alignment before the cylinder head 150 extends down onto the IC package.

SUMMARY OF THE INVENTION

Accordingly, in a general aspect of the present invention, a socket cover is mounted onto a socket for monitoring that an IC (integrated circuit) package is properly placed onto the socket with proper orientation and proper alignment. The socket cover includes a platform that is attached on top of the socket, and the platform has an opening for exposing pins of the socket when the platform is attached onto the top of the socket. The IC package is placed within the opening of the platform and onto the pins of the socket for testing of the IC package. A signal generator is disposed on a first side of the opening of the platform for emitting a signal across the opening toward a second side of the opening. A signal detector is disposed on the second side of the opening of the platform, and the signal detector is aligned with the signal generator such that the signal detector detects the signal emitted by the signal generator when the signal is not blocked.

The signal detector detects the signal emitted by the signal generator when the IC package that is placed with proper orientation and proper alignment within the opening of the platform does not block the signal. Alternatively, the signal detector does not detect the signal emitted by the signal generator when the IC package that is placed with improper orientation or improper alignment within the opening of the platform does block the signal.

The present invention may be used to particular advantage when a cylinder head extends down to press down the IC package onto the pins of the socket after placement of the IC package onto the pins of the socket. In that case, a cylinder controller controls the cylinder head to not extend down toward the IC package when the signal detector does not detect the signal emitted by the signal generator indicating that the IC package that is placed with improper orientation or improper alignment within the opening of the platform is blocking the signal. Alternatively, the cylinder controller controls the cylinder head to extend down toward the IC package when the signal detector detects the signal emitted by the signal generator indicating that the IC package that is placed with proper orientation and proper alignment within the opening of the platform is not blocking the signal.

In this manner, damage to an IC package from improper placement of the IC package within the socket with improper orientation or improper alignment is prevented.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, and 12 refer to elements having similar structure and function.

DETAILED DESCRIPTION

Figure 1:
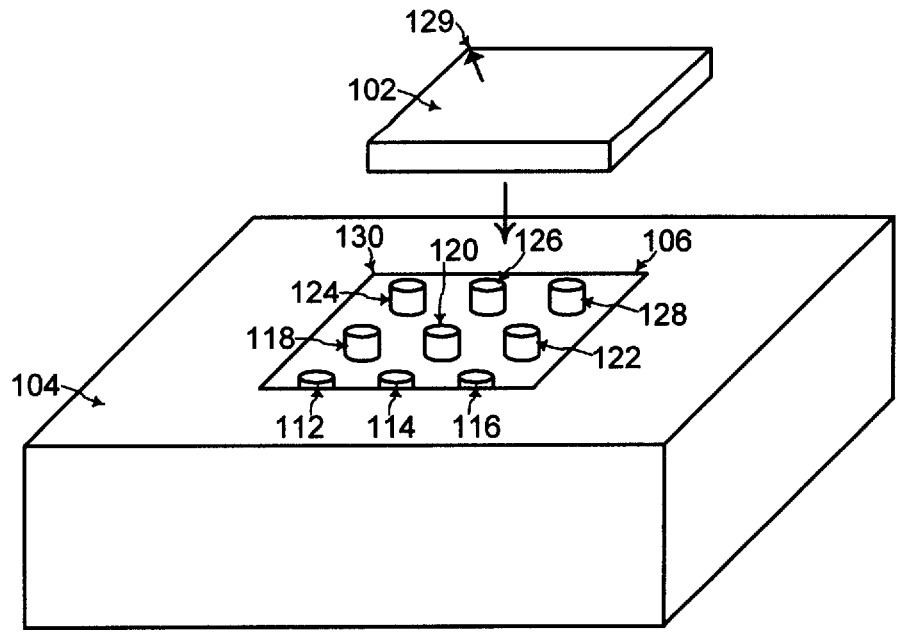
FIG. 1 shows components of a socket having a plurality of pins, according to the prior art.
Figure 4:
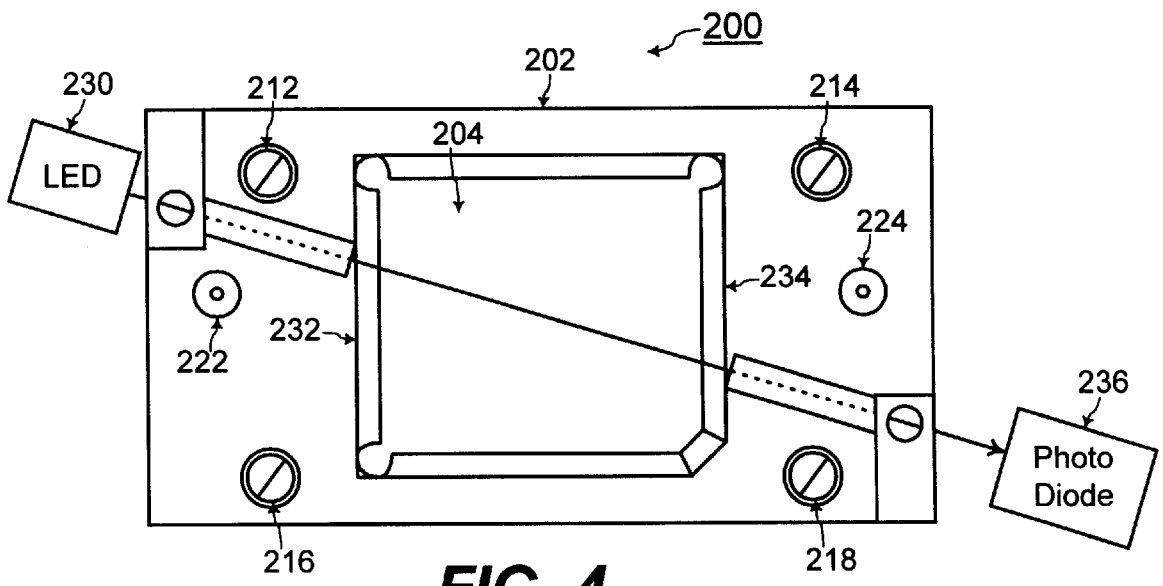
FIG. 4 shows components of a socket cover for automatically monitoring that an IC package is placed onto a socket of a test station with proper orientation and proper alignment, according to an embodiment of the present invention.

Referring to FIGS. 1 and 4, in one embodiment of the present invention, a socket cover 200 includes a platform 202 that is attached on top of the socket 104 for automatically monitoring placement of an IC package onto the socket 104 for proper orientation and proper alignment. The platform 202 has an opening 204 for exposing the pins of the socket 104 when the platform is attached on top of the socket 104.

A plurality of screws including a first screw 212, a second screw 214, a third screw 216, and a fourth screw 218 are used for attaching the platform 202 of the socket cover 200 on top of the socket 104. An LED (light emitting diode) 230 which is an example signal generator emits light as a signal from a first side 232 of the opening 204 and across the opening 204 toward a second side 234 of the opening 204. A photo diode 236 which is an example signal detector is disposed toward the second side 234 of the opening 204, and the photo diode 236 is aligned with the LED 230 such that the photo diode 236 detects the light emitted by the LED 230 when the light is not blocked from the LED 230 to the photo diode 236.

Figure 5:
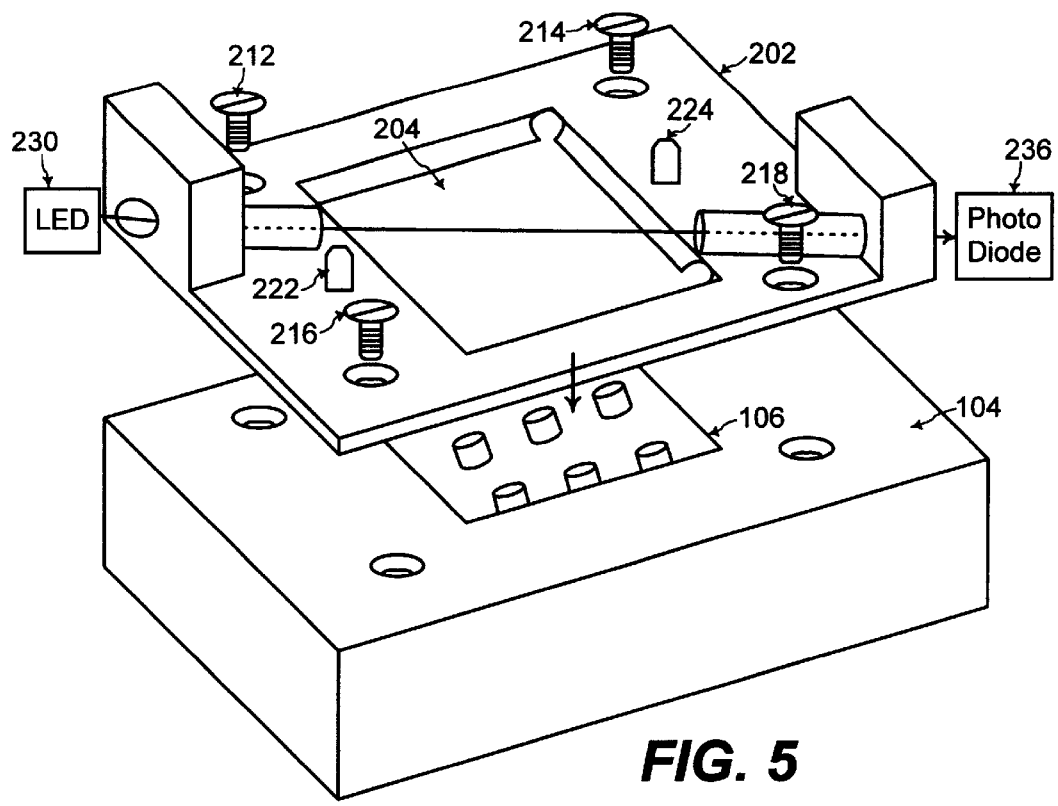
FIG. 5 illustrates the socket cover of FIG. 4 being placed onto the socket of FIG. 1, according to an embodiment of the present invention.
Figure 6:
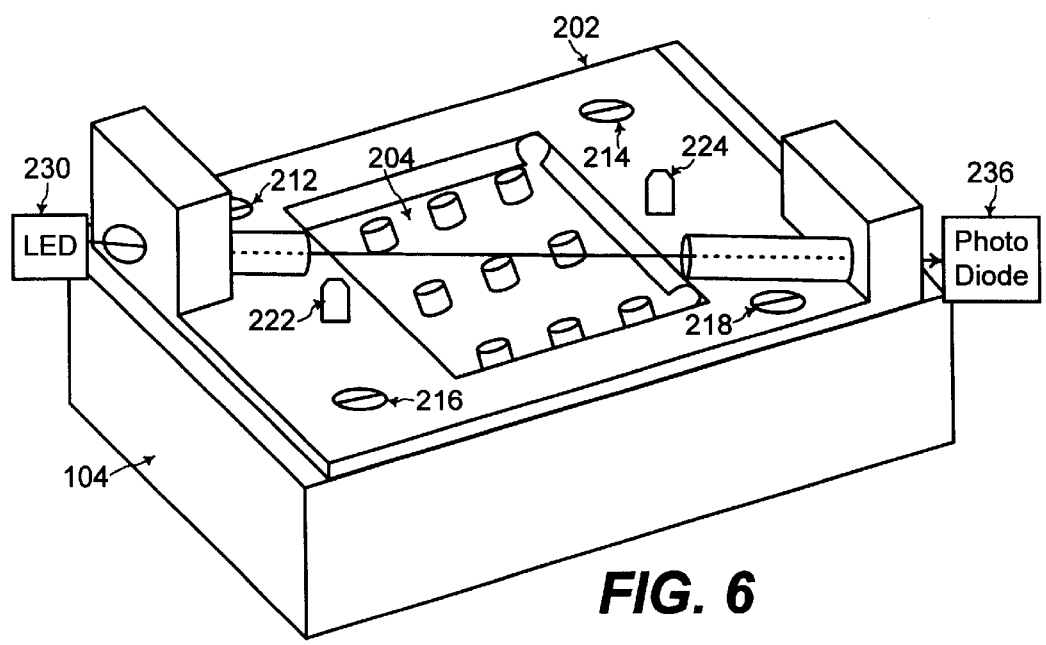
FIG. 6 illustrates the socket cover of FIG. 4 that has been attached onto the socket of FIG. 1, according to an embodiment of the present invention.

Referring to FIGS. 5 and 6, the platform 202 of the socket cover 200 is attached onto the socket 104 with the screws 212, 214, 216, and 218. The platform 202 is aligned to the socket 104 when the screws 212, 214, 216, and 218 are screwed into corresponding screw holes on the socket 104. When, the platform 202 is attached onto the socket 104 with proper alignment, the light emitted by the LED 230 travels to the photo diode 236 without the light being blocked.

Figure 7:
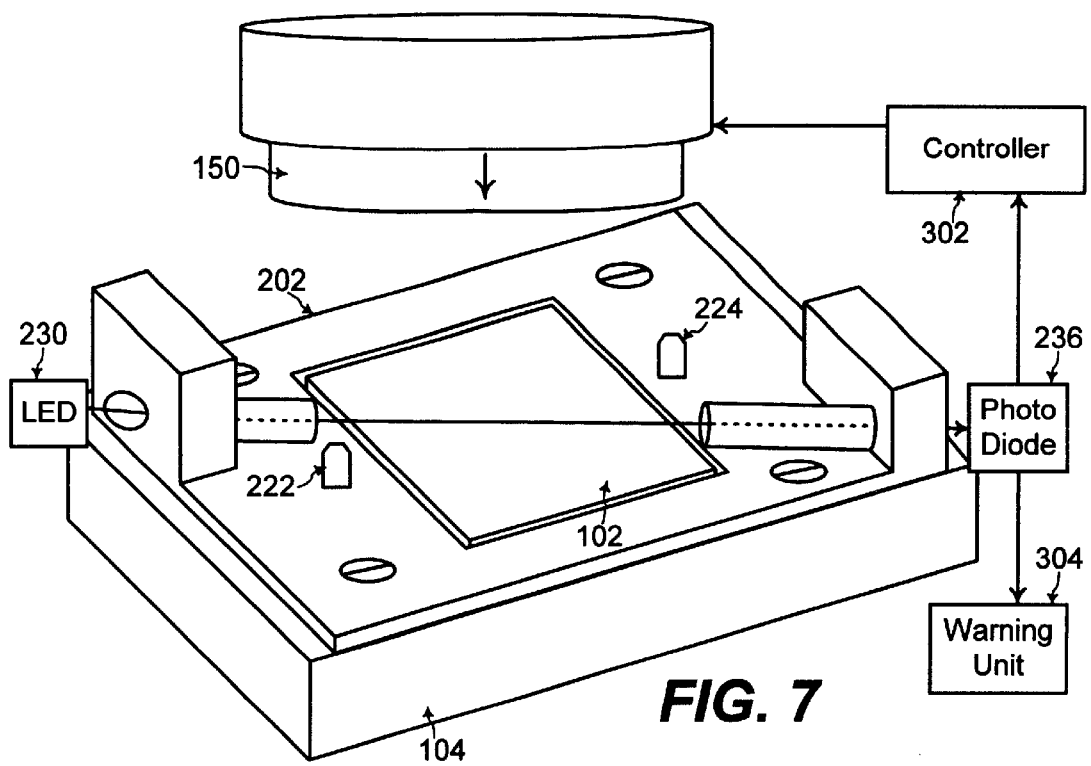
FIG. 7 illustrates proper placement with proper orientation and proper alignment of an IC package within the opening of a platform of the socket cover of FIG. 4, according to an embodiment of the present invention.

Referring to FIGS. 1 and 7, with the socket cover 200 attached onto the socket 104, the IC package 102 is placed within the opening 204 of the platform 202 of the socket cover 200 and onto the pins of the socket 104. If the IC package 102 is properly placed within the opening 204 and onto the pins of the socket 104 with proper orientation and with proper alignment, the light emitted by the LED 230 travels to the photo diode 236 without being blocked such that the photo diode 236 detects the light. With proper placement of the IC package 102 within the opening 204 and onto the pins of the socket 104 with proper orientation and with proper alignment, the IC package 102 does not block from the photo diode 236 the light emitted by the LED 230.

Figure 2:
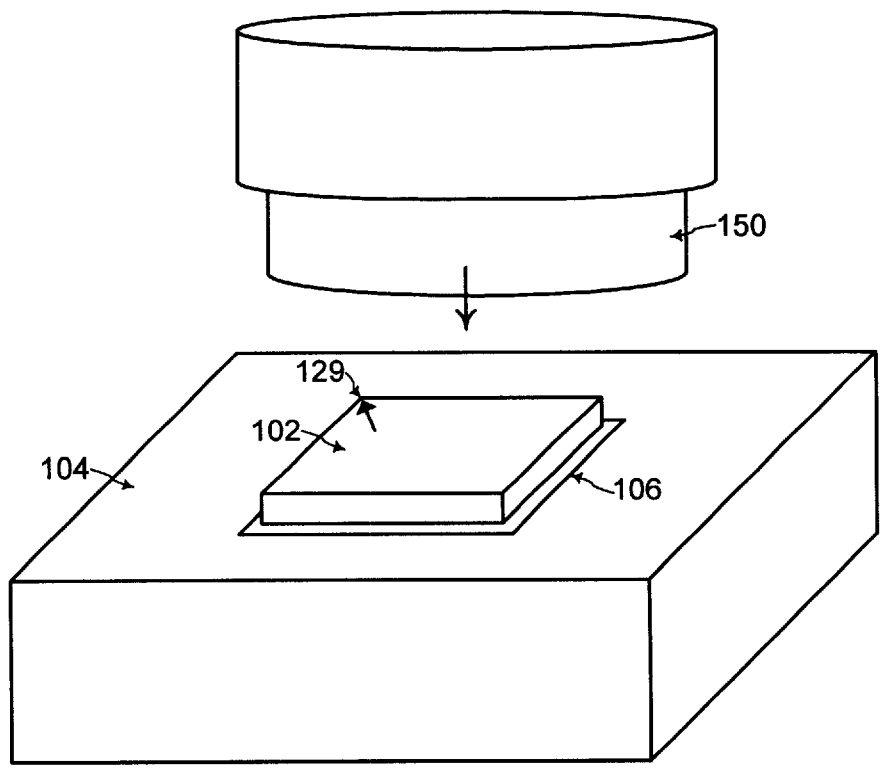
FIG. 2 shows placement of an IC package onto the socket of FIG. 1 with a cylinder head extending down onto the IC package, according to the prior art.
Figure 3:
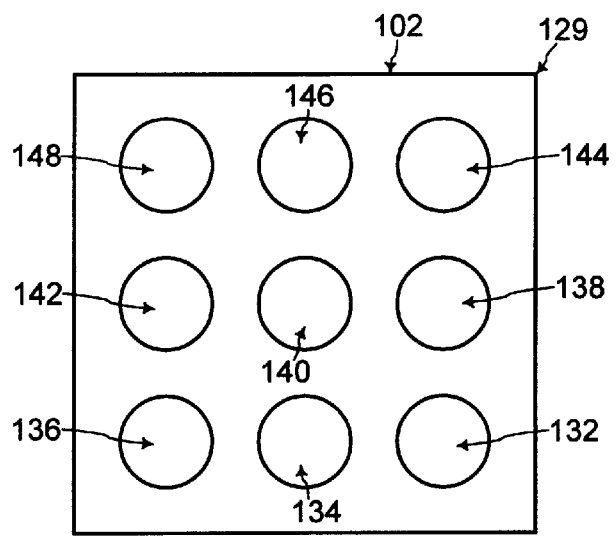
FIG. 3 shows a plurality of contact pads on the bottom of the IC package of FIG. 2 with each contact pad contacting one of the plurality of pins within the socket of FIG. 1.

After an operator places the IC package 102 within the opening 204 and onto the pins of the socket 104, the operator pushes a start button on a test station having the socket 104 to begin testing of the IC package 102. In the prior art test station of FIG. 2, with the push of the start button, the cylinder head 150 extends down onto the IC package 102. In contrast, with an embodiment of the present invention, the photo diode 236 is coupled to a cylinder controller 302 that controls the cylinder head 150. When the photo diode 236 detects the light emitted by the LED 230, the cylinder controller 302 controls the cylinder head 150 to extend down onto the IC package 102.

When the photo diode 236 detects the light emitted by the LED 230, the IC package is placed within the opening 204 and onto the pins of the socket 104 with proper orientation and with proper alignment such that the IC package 102 is not likely to be damaged when the cylinder head 150 presses down on the IC package 102. The platform 202 also includes a first guide post 222 and a second guide post 224 that fit within respective holes of the cylinder head 150 to guide the cylinder head 150 to proper placement over the IC package 102 when the cylinder head 150 extends down onto the IC package 102.

Figure 8:
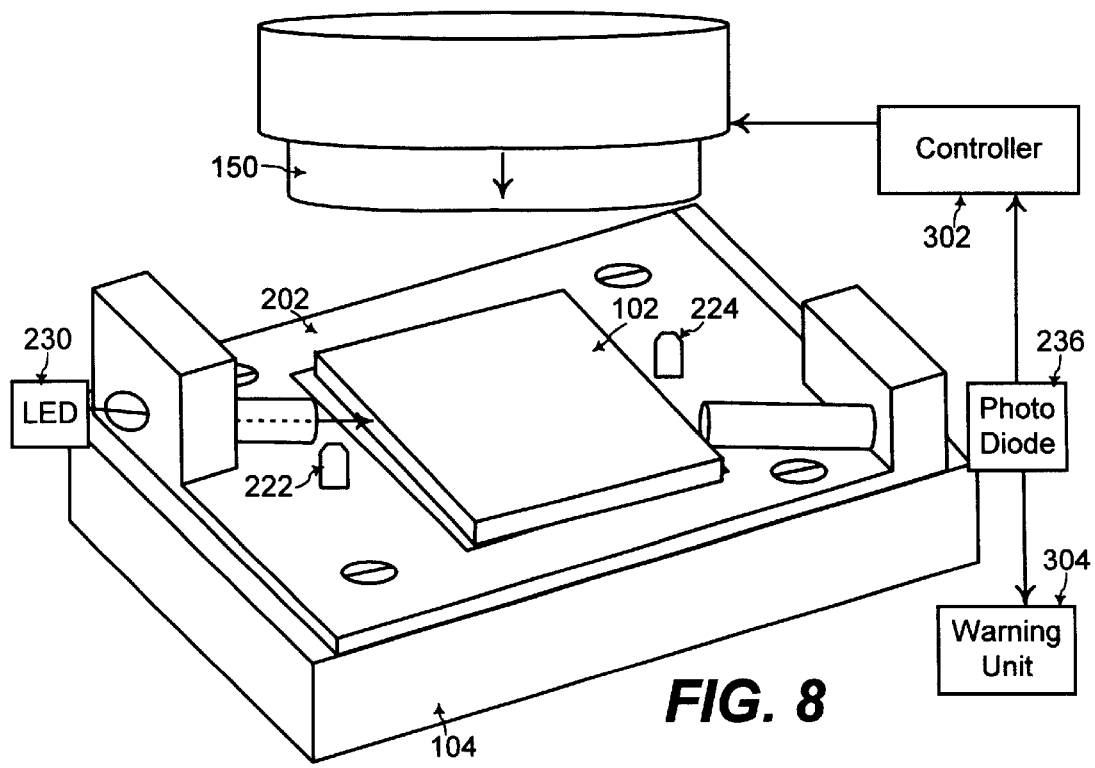
FIG. 8 illustrates improper placement with improper orientation or improper alignment of an IC package within the opening of the platform of the socket cover of FIG. 4, according to an embodiment of the present invention.

On the other hand, referring to FIG. 8, if the IC package 102 is improperly placed into the opening 204 of the platform 202 of the socket cover 200 with improper orientation or with improper alignment, then the IC package 102 blocks the light emitted by the LED 230. In that case, the photo diode 236 does not detect the light emitted by the LED 230. When the photo diode 236 does not detect the light emitted by the LED 230, the IC package is improperly placed within the opening 204 and onto the pins of the socket 104 with improper orientation or with improper alignment such that the IC package 102 is likely to be damaged when the cylinder head 150 presses down on the IC package 102. Thus, when the photo diode 236 does not detect the light emitted by the LED 230, the cylinder controller 302 controls the cylinder head 150 to not extend down onto the IC package 102.

The cylinder controller 302 may be any type of data processing device, as known to one of ordinary skill in the art of electronics. LED's (light emitting diodes) for emitting light and photo diodes for detecting light are known to one of ordinary skill in the art of electronics.

Further referring to FIGS. 7 and 8, the photo diode 236 is coupled to a warning unit 304 for generating an alarm signal when the photo diode 236 does not detect the light emitted by the LED 230 indicating that the IC package 102 is improperly placed within the opening 204 and onto the pins of the socket 104 with improper orientation or with improper alignment. In that case, the alarm signal may be a visual alarm or an audio alarm for warning the operator that the IC package 102 is improperly placed within the opening 204 and onto the pins of the socket 104 with improper orientation or with improper alignment. Warning units for providing visual alarms and audio alarms are known to one of ordinary skill in the art of electronics.

Referring to FIG. 7, in one embodiment of the present invention, after completion of testing of the IC package 102 within the socket 104, the cylinder head controller 302 controls the cylinder head 150 to retract away from the IC package 102 when the cylinder head 150 is extended to press down on the IC package 102. After the completion of testing of the IC package 102 and after the cylinder head 150 retracts away from the IC package 102, the IC package 102 is removed from the socket 104. Such removal of the IC package 102 blocks the light emitted by the LED 230 from reaching the photo diode 236.

In this manner, when the photo diode 236 does not detect the light from the LED 230 as the IC package 102 is removed from the socket 104, the cylinder controller 302 is reset indicating that another IC package may be tested within the socket 104. After completion of testing of the IC package 102, if the cylinder controller 302 is not reset, then the cylinder controller 302 controls the cylinder head 150 to not extend down to prevent repeated testing of the IC package 102.

Figure 9:
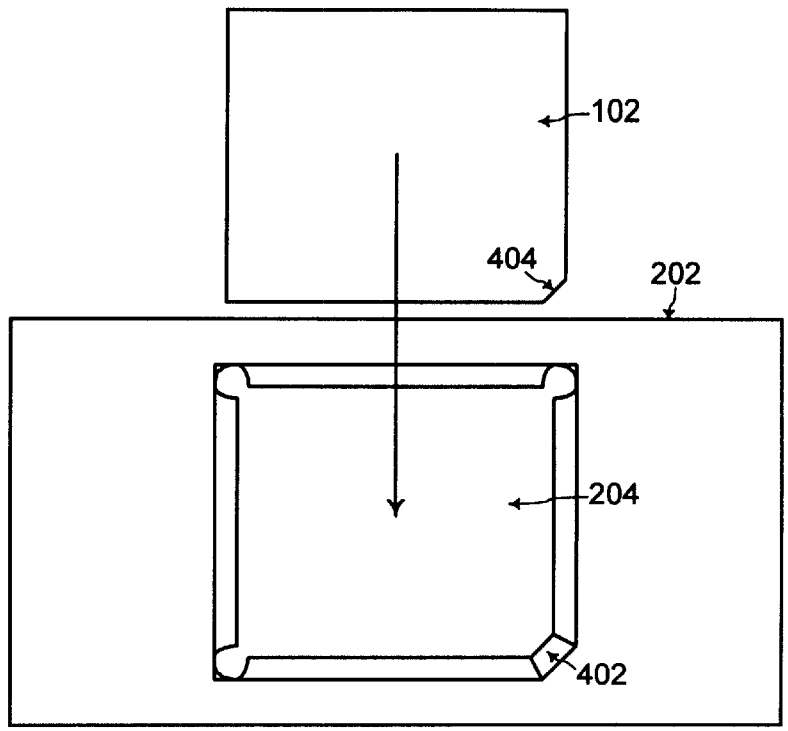
FIGS. 9 and 10 show a top view of the IC package being properly placed with proper orientation and proper alignment within the opening of the platform of the socket cover of FIG. 4, according to an embodiment of the present invention.
Figure 10:
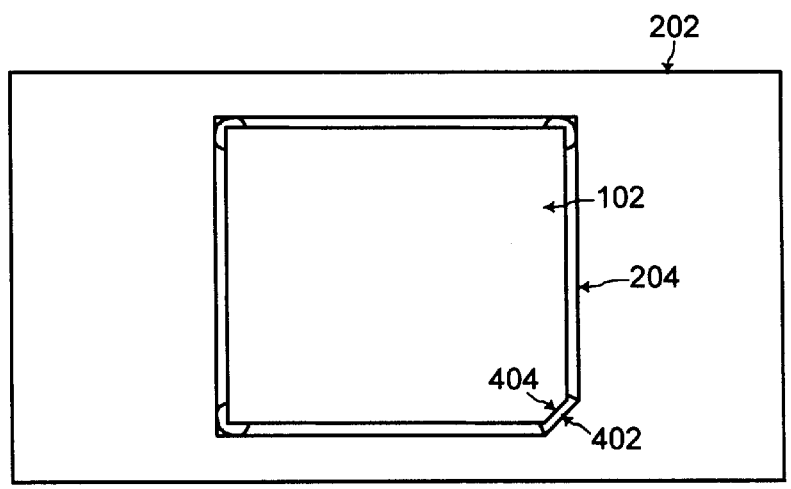

Referring to FIG. 9, for further guiding an operator to place the IC package 102 with proper orientation, the opening 204 of the platform 202 of the socket cover 200 has a chamfered corner 402. Referring to FIGS. 9 and 10, for proper placement of the IC package 102 within the opening 204, the chamfered corner 402 of the opening 204 is aligned with a chamfered corner 404 of the IC package 102.

Figure 11:
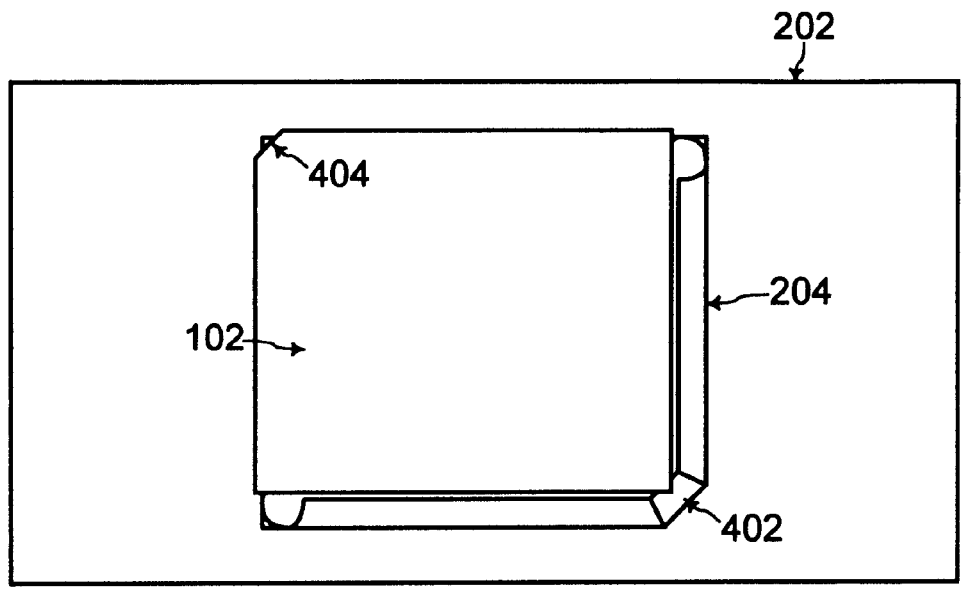
FIG. 11 shows a top view of the IC package being placed with improper orientation within the opening of the platform of the socket cover of FIG. 4, according to an embodiment of the present invention.
Figure 12:
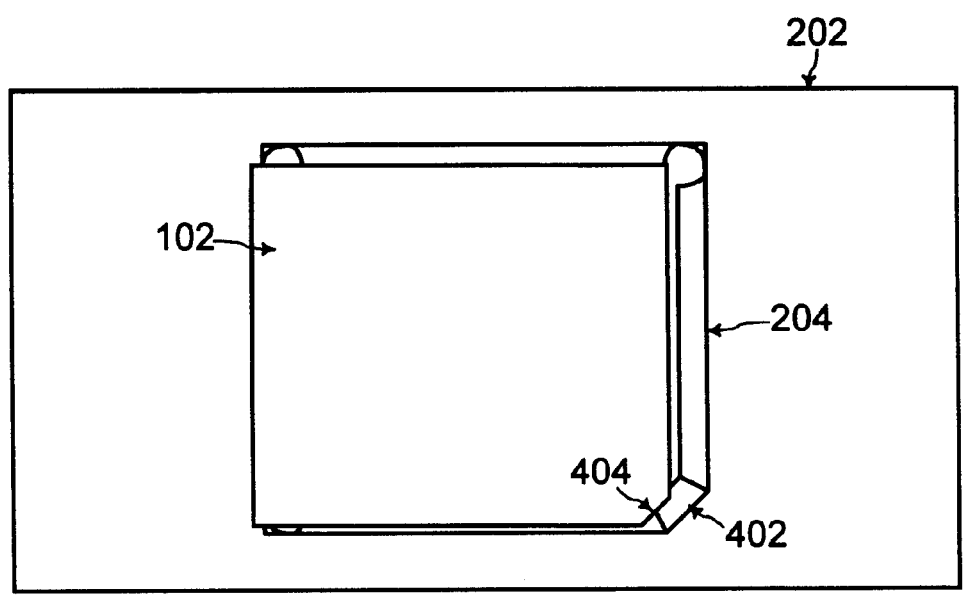
FIG. 12 shows a top view of the IC package being placed with improper alignment within the opening of the platform of the socket cover of FIG. 4, according to an embodiment of the present invention.

Referring to FIG. 11, the IC package 102 is placed within the opening 204 of the platform 202 with improper orientation as the chamfered corner 402 of the opening 204 is not aligned with the chamfered corner 404 of the IC package 102. Referring to FIG. 12, the IC package 102 is placed within the opening 204 of the platform 202 with relatively proper orientation as the chamfered corner 402 of the opening 204 is near the chamfered corner 404 of the IC package 102. However, the IC package 102 is misaligned within the opening 204 by being displaced with respect to the center of the opening 204.

In this manner, with the socket cover 200 attached on top of a socket and with the LED 230 and the photo diode 236, proper placement of an IC package with proper orientation and with proper alignment onto the socket is automatically monitored. In addition, when the IC package is improperly placed onto the socket with improper orientation or improper alignment, a cylinder head is controlled to not extend down onto the IC package to automatically prevent damage to the improperly placed IC package.

The foregoing is by way of example only and is not intended to be limiting. For example, the present invention is illustrated for an example socket and the corresponding socket cover that fits over such an example socket. The present invention may be used with any other shapes of sockets and socket covers for testing various types of IC packages, as would be apparent to one of ordinary skill in the art of integrated circuit manufacture from the description herein.

Furthermore, as will be understood by those skilled in the art, the structures described herein may be made or used in the same way regardless of their position and orientation. Accordingly, it is to be understood that terms and phrases such as "top," "side," and "onto" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

We claim:

1. A socket cover for monitoring that an IC (integrated circuit) package is properly placed onto a socket, the socket cover comprising:

a platform that is attached on top of said socket, said platform having an opening for exposing pins of said socket when said platform is attached onto said top of said socket;

wherein said IC package is placed within said opening of said platform and onto said pins of said socket for testing of said IC package;

a signal generator disposed on a first side of said opening of said platform for emitting a signal across said opening toward a second side of said opening; and a signal detector disposed on said second side of said opening of said platform, wherein said signal detector is aligned with said signal generator such that said signal detector detects said signal emitted by said signal generator when said signal is not blocked;

and wherein said signal detector detects said signal emitted by said signal generator when said IC package that is placed with proper orientation and proper alignment within said opening of said platform does not block said signal;

and wherein said signal detector does not detect said signal emitted by said signal generator when said IC package that is placed with improper orientation or improper alignment within said opening of said platform does block said signal.

2. The socket cover of claim 1, wherein said signal detector is coupled to a warning unit for generating an alarm signal when said signal detector does not detect said signal emitted by said signal generator when said IC package that is placed with improper orientation or improper alignment within said opening of said platform does block said signal.

3. The socket cover of claim 1, wherein a cylinder head extends down to press down said IC package onto said pins of said socket after placement of said IC package onto said pins of said socket, and said socket cover further comprising:

a cylinder controller for controlling said cylinder head to not extend down toward said IC package when said signal detector does not detect said signal emitted by said signal generator indicating that said IC package that is placed with improper orientation or improper alignment within said opening of said platform is blocking said signal;

and wherein said cylinder controller controls said cylinder head to extend down toward said IC package when said signal detector detects said signal emitted by said signal generator indicating that said IC package that is placed with proper orientation and proper alignment within said opening of said platform is not blocking said signal.

4. The socket cover of claim 3, wherein said cylinder controller controls said cylinder head to retract away from said IC package when said cylinder head is extended to press down on said IC package toward said pins of said socket and after completion of testing of said IC package within said socket, and wherein removal of said IC package after said completion of testing of said IC package causes resetting of said cylinder controller when said IC package blocks said signal from reaching said signal detector during said removal of said IC package from said socket.

5. The socket cover of claim 4, wherein said cylinder controller controls said cylinder head that is retracted to not extend down after completion of testing of said IC package if said cylinder controller is not reset, to prevent repeated testing of said IC package.

6. The socket cover of claim 3, further comprising:
guide posts disposed on said platform for guiding placement of said cylinder head onto said IC package when said cylinder head extends down.

7. The socket cover of claim 1, further comprising:
a chamfered corner of the opening of said platform, wherein said chamfered corner of the opening of said platform aligns with a chamfered corner of said IC package when said IC package is placed within said opening of said platform with proper orientation.

8. The socket cover of claim 1, wherein said signal generator is a LED (light emitting diode) for emitting light as said signal toward said signal detector that is a photo diode for detecting said light.

9. A socket cover for monitoring that an IC (integrated circuit) package is properly placed onto a socket, the socket cover comprising:
a platform that is attached on top of said socket, said platform having an opening for exposing pins of said socket when said platform is attached onto said top of said socket;
wherein said IC package is placed within said opening of said platform and onto said pins of said socket for testing of said IC package;
a signal generator disposed on a first side of said opening of said platform for emitting a signal across said opening toward a second side of said opening;
a signal detector disposed on said second side of said opening of said platform, wherein said signal detector is aligned with said signal generator such that said signal detector detects said signal emitted by said signal generator when said signal is not blocked;
and wherein said signal generator is a LED (light emitting diode) for emitting light as said signal toward said signal detector that is a photo diode for detecting said light;
and wherein said signal detector detects said signal emitted by said signal generator when said IC package that is placed with proper orientation and proper alignment within said opening of said platform does not block said signal;

and wherein said signal detector does not detect said signal emitted by said signal generator when said IC package that is placed with improper orientation or improper alignment within said opening of said platform does block said signal;

and wherein said signal detector is coupled to a warning unit for generating an alarm signal when said signal detector does not detect said signal emitted by said signal generator when said IC package that is placed with improper orientation or improper alignment within said opening of said platform does block said signal;

and wherein a cylinder head extends down to press down said IC package onto said pins of said socket after placement of said IC package onto said pins of said socket;

a cylinder controller for controlling said cylinder head to not extend down toward said IC package when said signal detector does not detect said signal emitted by said signal generator indicating that said IC package that is placed with improper orientation or improper alignment within said opening of said platform is blocking said signal;

and wherein said cylinder controller controls said cylinder head to extend down toward said IC package when said signal detector detects said signal emitted by said signal generator indicating that said IC package that is placed with proper orientation and proper alignment within said opening of said platform is not blocking said signal;

and wherein said cylinder controller controls said cylinder head to retract away from said IC package when said cylinder head is extended to press down on said IC package toward said pins of said socket and after completion of testing of said IC package within said socket, and wherein removal of said IC package after said completion of testing of said IC package causes resetting of said cylinder controller when said IC package blocks said signal from reaching said signal detector during said removal of said IC package from said socket;

and wherein said cylinder controller controls said cylinder head that is retracted to not extend down after completion of testing of said IC package if said cylinder controller is not reset, to prevent repeated testing of said IC package;

a chamfered corner of the opening of said platform, wherein said chamfered corner of the opening of said platform aligns with a chamfered corner of said IC package when said IC package is placed within said opening of said platform with proper orientation; and guide posts disposed on said platform for guiding placement of said cylinder head onto said IC package when said cylinder head extends down.

10. A method for monitoring that an IC (integrated circuit) package is properly placed onto a socket, the method including the steps of:
attaching a platform of a socket cover on top of said socket, said platform having an opening for exposing pins of said socket when said platform is attached onto said top of said socket;
placing said IC package within said opening of said platform and onto said pins of said socket for testing of said IC package;
emitting from a signal generator, disposed on a first side of said opening, a signal across said opening toward a second side of said opening;

detecting, at a signal detector disposed on said second side of said opening of said platform, said signal emitted by said signal generator when said signal is not blocked;

detecting at said signal detector said signal emitted by said signal generator when said IC package that is placed with proper orientation and proper alignment within said opening of said platform does not block said signal; and not detecting at said signal detector said signal emitted by said signal generator when said IC package that is placed with improper orientation or improper alignment within said opening of said platform does block said signal.

11. The method of claim 10, further including the step of:
generating an alarm signal when said signal detector does not detect said signal emitted by said signal generator when said IC package that is placed with improper orientation or improper alignment within said opening of said platform does block said signal.

12. The method of claim 10, wherein a cylinder head extends down to press down said IC package onto said pins of said socket after placement of said IC package onto said pins of said socket, and wherein the method further includes the steps of:

controlling said cylinder head to not extend down toward said IC package when said signal detector does not detect said signal emitted by said signal generator indicating that said IC package that is placed with improper orientation or improper alignment within said opening of said platform is blocking said signal; and controlling said cylinder head to extend down toward said IC package when said signal detector detects said signal emitted by said signal generator indicating that said IC package that is placed with proper orientation and proper alignment within said opening of said platform is not blocking said signal.

13. The method of claim 12, further including the step of:
controlling said cylinder head to retract away from said IC package when said cylinder head is extended to press down on said IC package toward said pins of said socket and after completion of testing of said IC package within said socket;

and wherein removal of said IC package after said completion of testing of said IC package causes resetting of said cylinder head when said IC package blocks said signal from reaching said signal detector during said removal of said IC package from said socket.

14. The method of claim 13, further including the step of:
controlling said cylinder head that is retracted to not extend down after completion of testing of said IC package if said cylinder head is not reset, to prevent repeated testing of said IC package.

15. The method of claim 10, further including the step of:
aligning a chamfered corner of the opening of said platform with a chamfered corner of said IC package such that said IC package is placed within said opening of said platform with proper orientation.

16. The method of claim 10, wherein said signal generator is a LED (light emitting diode) for emitting light as said signal toward said signal detector that is a photo diode for detecting said light.

* * * * *